United States Patent
Nacson et al.

(10) Patent No.: US 9,377,498 B2
(45) Date of Patent: Jun. 28, 2016

(54) FAULT PREDICTION IN ELECTRONIC TRANSMISSION NETWORKS

(75) Inventors: Sabatino Nacson, Ariel (IL); Boris Fradkin, Oranit (IL)

(73) Assignee: ELECTRICAL GRID MONITORING LTD., Rosh Haayin (IL)

( * ) Notice: Subject to any disclaimer, the term of this patent is extended or adjusted under 35 U.S.C. 154(b) by 1228 days.

(21) Appl. No.: 12/518,539

(22) PCT Filed: Dec. 10, 2007
(Under 37 CFR 1.47)

(86) PCT No.: PCT/IL2007/001521
§ 371 (c)(1),
(2), (4) Date: Jan. 5, 2010

(87) PCT Pub. No.: WO2008/072226
PCT Pub. Date: Jun. 19, 2008

(65) Prior Publication Data
US 2010/0315092 A1     Dec. 16, 2010

Related U.S. Application Data

(60) Provisional application No. 60/869,360, filed on Dec. 11, 2006.

(51) Int. Cl.
| G01R 31/00 | (2006.01) |
| G01R 31/02 | (2006.01) |
| G01R 19/25 | (2006.01) |
| G01R 31/11 | (2006.01) |
| G01R 35/02 | (2006.01) |

(52) U.S. Cl.
CPC .......... *G01R 31/025* (2013.01); *G01R 19/2513* (2013.01); *G01R 31/11* (2013.01); *G01R 35/02* (2013.01)

(58) Field of Classification Search
CPC .. G01R 31/025; G01R 19/2513; G01R 35/02; G01R 31/11
See application file for complete search history.

(56) References Cited

U.S. PATENT DOCUMENTS

| 3,983,554 A | 9/1976 | Goode |
| 3,984,734 A | 10/1976 | Becker |

(Continued)

FOREIGN PATENT DOCUMENTS

| DE | 10151775 | 5/2003 | |
| JP | WO2006062193 | * 6/2006 | ............. H04L 12/28 |
| WO | 9605516 | 2/1996 | |

OTHER PUBLICATIONS

Valdes et al.,"Ground Fault Detection in Multiple Source Solidly Grounded Systems via the Single-Processor Concept for Circuit Protection", IEEE, 2005, pp. 249-256, vol. 42, Issue 3.

*Primary Examiner* — Jeff Natalini
(74) *Attorney, Agent, or Firm* — Daniel J. Swirsky; AlphaPatent Associates Ltd.

(57) ABSTRACT

A system and a method for measuring leakage current in an electrical transmission network. The system contains a plurality of electric current measurement devices distributed along the electrical transmission network and at least one central controller. The current measurement devices measure the electric current substantially continuously or repeatedly and report to the central controller. The central controller performs analysis of the measurements of the electric current along the transmission network and calculates the leakage current.

33 Claims, 10 Drawing Sheets

(56) References Cited

U.S. PATENT DOCUMENTS

| | | | |
|---|---|---|---|
| 4,520,417 A * | 5/1985 | Frank | 361/45 |
| 5,446,387 A | 8/1995 | Eriksson et al. | |
| 5,473,244 A | 12/1995 | Libove et al. | |
| 5,726,578 A | 3/1998 | Hook | |
| 5,804,977 A | 9/1998 | Consiglio | |
| 5,973,500 A | 10/1999 | Moreau et al. | |
| 6,507,184 B1 | 1/2003 | Elston | |
| 6,933,693 B2 * | 8/2005 | Schuchmann | 318/432 |
| 2003/0112015 A1 | 6/2003 | Takakamo et al. | |
| 2004/0036478 A1 | 2/2004 | Logvinov et al. | |
| 2004/0061489 A1 * | 4/2004 | Ramirez | 324/117 R |
| 2005/0225909 A1 | 10/2005 | Yoshizaki et al. | |
| 2006/0125486 A1 * | 6/2006 | Premerlani et al. | 324/512 |
| 2007/0145954 A1 * | 6/2007 | Kawahara | B60L 11/1864 320/150 |
| 2008/0195260 A1 * | 8/2008 | Taniguchi et al. | 701/1 |
| 2008/0243440 A1 * | 10/2008 | Matsumoto et al. | 702/188 |

* cited by examiner

FAULT PREDICTION IN ELECTRONIC TRANSMISSION NETWORKS

CROSS-REFERENCE TO RELATED APPLICATIONS

This application is a National Phase Application under 35 U.S.C. 371 of PCT International Apllication No. PCT/IL2007/001521, which has an international filing date of Dec. 10, 2007, and which claims priority from U.S. Provisional Patent Application Ser. No. 60/869,360 filed Dec. 11, 2006, entitled "Fault Prediction in Electric Transmission Networks", the disclosure of which is hereby incorporated by reference.

FIELD AND BACKGROUND OF THE INVENTION

The present invention relates to detecting faults within electric transmission networks, and, more particularly, but not exclusively to locating and measuring leakage current in an electric transmission network.

Electric insulation of the cables of an electric transmission network deteriorates with time. Insulation faults cause localized leakage current. Leakage currents cause loss of energy, increase fuel consumption, and require higher investment in power generating facilities. Strong leakage currents are hazardous to humans, especially to network maintenance workers. If an insulation fault is not located and repaired in time it can damage the network (such as neighboring cables) and cause power outage. Leakage currents can cause power outages that can damage electronic equipment that feeds off the network.

Locating leakage currents in an operational electric transmission network is currently performed manually, and thus infrequently. Every segment of the network is tested at a different time, and thus, there is no continuous measurement of any part of the network, and there is no knowledge of the condition of the network as a whole.

There is thus a widely recognized need for, and it would be highly advantageous to have, an insulation fault prediction system for electric transmission networks devoid of the above limitations.

SUMMARY OF THE INVENTION

According to one aspect of the present invention there is provided a method for leakage current measurements in an electrical transmission network, the method including:
 distributing a plurality of electric current measurement devices within the electrical transmission network,
 performing measurements of electric current, by at least two of the electric current measurement devices, and
 analyzing the measurements to calculate leakage current.

According to another aspect of the present invention there is provided a method for leakage current measurements in an electrical transmission network wherein the electrical transmission network contains underground electrical transmission network and/or overhead electrical transmission network.

According to still another aspect of the present invention there is provided a method for leakage current measurements in an electrical transmission network wherein the step of analyzing include detecting a leakage current exception, and/or predicting a fault in the electrical transmission network, wherein the fault prediction is associated with the current leakage.

According to yet another aspect of the present invention there is provided a method for leakage current measurements in an electrical transmission network wherein the step of performing measurements is being performed in a manner which may be any of automatically, continuously, repeatedly, on-demand from another one of the plurality of electric current measurement devices, synchronously with another one of the plurality of electric current measurement devices, and manually.

Further according to another aspect of the present invention there is provided a method for leakage current measurements in an electrical transmission network wherein the step of analyzing the measurements is being performed in a manner which may be any of: automatically, continuously, repeatedly, on-demand from another leakage current measurement devices, synchronously with another leakage current measurement devices, and manually.

Still further according to another aspect of the present invention there is provided a method for leakage current measurements in an electrical transmission network wherein the step of performing the measurements of electric current includes measuring the electric current for each power-line conductor of the electrical transmission network.

Even further according to another aspect of the present invention there is provided a method for leakage current measurements in an electrical transmission network wherein the step of analyzing the measurements includes calculating leakage current for each power-line conductor of the electrical transmission network.

Also according to another aspect of the present invention there is provided a method for leakage current measurements in an electrical transmission network wherein the step of performing the measurements of electric current includes measuring the electric current for each current phase of the electrical transmission network.

Additionally according to another aspect of the present invention there is provided a method for leakage current measurements in an electrical transmission network wherein the step of performing the analyzing the measurements includes calculating leakage current for each current phase of the electrical transmission network.

According to yet another aspect of the present invention there is provided a method for leakage current measurements in an electrical transmission network the method additionally including communicating the measurements within the network.

According to still another aspect of the present invention there is provided a method for leakage current measurements in an electrical transmission network wherein the analysis includes estimating leakage current within a segment of the electrical transmission network.

Further according to another aspect of the present invention there is provided a method for leakage current measurements in an electrical transmission network wherein the step of estimating leakage current includes comparing the measurements of electric current performed for at least two points of the segment.

Still further according to another aspect of the present invention there is provided a method for leakage current measurements in an electrical transmission network wherein the step of comparing the measurements of electric current includes comparing electric current measurements performed substantially simultaneously for two or more adjacent measurement points along a power-line conductor, two or more different parallel conductors, and/or two or more associated current phases.

Even further according to another aspect of the present invention there is provided a method for leakage current measurements in an electrical transmission network wherein the step of comparing the measurements of electric current includes comparing time-consecutive measurements of electric current.

Also according to another aspect of the present invention there is provided a method for leakage current measurements in an electrical transmission network wherein the step of comparing the measurements of electric current includes averaging the measurements over time, and/or averaging the comparisons over time.

Additionally according to another aspect of the present invention there is provided a method for leakage current measurements in an electrical transmission network wherein the step of communicating the measurements includes communicating the measurements to a control and analysis center, and performing the step of analyzing the measurements at least partially at the control and analysis center.

According to yet another aspect of the present invention there is provided a method for leakage current measurements in an electrical transmission network wherein the step of analyzing the measurements to detect an exception is performed at least partially at the electric current measurement devices.

According to still another aspect of the present invention there is provided a method for leakage current measurements in an electrical transmission network additionally including communicating instructions, from the control and analysis center, to at least one of the electric current measurement devices, wherein the instructions comprise:
- instructions pertaining to the step of performing measurements,
- instructions pertaining to the step of performing analysis, and/or
- instructions pertaining to self testing the electric current measurement device, and
- communicating responses pertaining to the instructions from the electric current measurement device to the control and analysis center.

Further according to another aspect of the present invention there is provided a method for leakage current measurements in an electrical transmission network wherein the step of communicating the measurements includes:
- communicating the measurements between at least two of the electric current measurement devices, and
- performing the step of analyzing the measurements in at least one of the electric current measurement devices.

Still further according to another aspect of the present invention there is provided a method for leakage current measurements in an electrical transmission network wherein the step of measuring electric current includes measuring electromagnetic field around a power-line conductor Even further according to another aspect of the present invention there is provided a method for leakage current measurements in an electrical Lansmission network wherein the step of communicating the measurements includes using power-line carrier (PLC) communication technology.

Also according to another aspect of the present invention there is provided a method for leakage current measurements in an electrical transmission network wherein the step of communicating the measurements includes inducing a PLC signal to a power-line conductor using inductance.

Additionally according to another aspect of the present invention there is provided a method for leakage current measurements in an electrical transmission network wherein the step of communicating the measurements includes inducing a PLC signal to a power-line conductor different from the power-line conductor for which the communicated measurements of electric current are performed.

According to still another aspect of the present invention there is provided a method for leakage current measurements in an electrical transmission network wherein the step of communicating the measurements to a control and analysis center includes communicating the measurements between successive electric current measurement devices.

According to yet another aspect of the present invention there is provided a method for leakage current measurements in an electrical transmission network wherein the step of communicating the measurements to a control and analysis center includes communicating the measurements directly from the electric current measurement devices to the measurements to a control and analysis center.

Further according to another aspect of the present invention there is provided a method for leakage current measurements in an electrical transmission network wherein the electric current measurement devices derive electric power from an electromagnetic field surrounding a power-line conductor.

Still further according to another aspect of the present invention there is provided a method for leakage current measurements in an electrical transmission network wherein the power-line conductor from which electric current measurement device derive electric power is different from a power-line conductor for which the electric current measurement device performs the measurements of electric current.

Even further according to another aspect of the present invention there is provided a method for leakage current measurements in an electrical transmission network wherein the step of analyzing the measurements to detect an exception includes using an expert system.

Also according to another aspect of the present invention there is provided a method for leakage current measurements in an electrical transmission network additionally including providing alarm upon detecting the exception, the alarm provided to a user, and/or to an information computing system.

According to another aspect of the present invention there is provided a method for detecting faults in an electric transmission network, the method including:
- sending a fast rise-time electric pulse along an electric conductor,
- measuring reflected signal,
- detecting an amplitude variation of the reflected signal as a function of time, and
- converting a time of the amplitude variation to a location along the electric conductor.

According to yet another aspect of the present invention there is provided a method for detecting faults in an electric transmission network
- distributing a plurality of fault-detection devices within the electrical transmission network,
- sending, from a first fault-detection device, a fast rise-time electric pulse along an electric conductor of the electrical transmission network,
- measuring, at a second fault-detection device, transmitted signal corresponding to the fast rise-time electric pulse,
- detecting an amplitude variation of the transmitted signal as a function of time, and
- converting a time of the amplitude variation to a location along the electric conductor.

According to still another aspect of the present invention there is provided a leakage current measuring device containing:
- a power interface, a current sensor operative to measure current in an electric conductor to form a current measurement, a communication interface, and a processing unit operative to analyze the current measurements to calculate leakage current.

Further according to another aspect of the present invention there is provided a leakage current measuring device wherein the power interface is operative to draw electric power from electromagnetic field around a power-line conductor.

Still further according to another aspect of the present invention there is provided a leakage current measuring device wherein the communication interface is operative to communicate using power line carrier (PLC) communication technology.

Yet further according to another aspect of the present invention there is provided a leakage current measuring device wherein the electric conductor is a component of an electrical transmission network.

Even further according to another aspect of the present invention there is provided a leakage current measuring device wherein the electrical transmission network contains any combination of an underground electrical transmission network and an overhead electrical transmission network.

Also according to another aspect of the present invention there is provided a leakage current measuring device wherein the processing unit is additionally operative to detect a leakage current exception and/or to predict a fault in the electrical transmission network, wherein the fault prediction is associated with the current leakage.

Additionally according to another aspect of the present invention there is provided a leakage current measuring device wherein the processing unit is additionally operative to perform the current measurement automatically, continuously, repeatedly, on-demand from another leakage current measurement devices, synchronously with another leakage current measurement devices, and/or manually.

According to another aspect of the present invention there is provided a leakage current measuring device wherein the processing unit is additionally operative to analyze the measurements in a manner that is any of automatically, continuously, repeatedly, on-demand from another leakage current measurement devices, synchronously with another leakage current measurement devices, and/or manually.

According to still another aspect of the present invention there is provided a leakage current measuring device wherein the processing unit is additionally operative to average the electric current measurements over time.

According to yet another aspect of the present invention there is provided a leakage current measuring device additionally operative to measure electric current contains measuring electromagnetic field around a power-line conductor Also according to another aspect of the present invention there is provided a three-phase leakage current measuring device containing a power interface, a three-phase current sensor operative to measure phase currents of a three-phase electric transmission line to form three current measurements, a communication interface, and a processing unit operative to analyze the current measurements to calculate leakage current.

Additionally according to another aspect of the present invention there is provided a three-phase leakage current measuring device wherein the a processing unit operative to analyze the current measurements to calculate leakage current for each current phase of the electrical transmission network.

According to another aspect of the present invention there is provided a leakage current measuring system containing a plurality of leakage current measuring devices deployed along an electric transmission network. Each of the leakage current measuring devices containing:

a power interface, a current sensor operative to measure current in an electric conductor to form a current measurement, a communication interface operative to communicate the current measurements between at least two of the plurality of leakage current measuring devices, and a processing unit operative to analyze the current measurements to calculate leakage current from the current measurements communicated by at least two of the plurality of leakage current measuring devices.

According to yet another aspect of the present invention there is provided a leakage current measuring system wherein the processing unit operative to analyze the current measurements to calculate leakage current by comparing electric current measurements performed substantially simultaneously for:

at least two adjacent measurement points along a power-line conductor, at least two different parallel conductors, and/or at least two associated current phases.

According to still another aspect of the present invention there is provided a leakage current measuring system additionally containing a control and analysis center operative to receive the current measurements from the leakage current measuring devices and to analyze the current measurements.

Further according to another aspect of the present invention there is provided a leakage current measuring system wherein the control and analysis center is additionally operative to communicate instructions to at least one of the plurality of leakage current measurement devices, wherein the instructions comprise any of instructions pertaining to the step of performing measurements, instructions pertaining to the step of performing analysis, and instructions pertaining to self testing the electric current measurement device, and to receive responses pertaining to the instructions from at least one of the plurality of leakage current measurement device.

Still further according to another aspect of the present invention there is provided a leakage current measuring system wherein the leakage current measurement devices are operative to communicate the current measurements between electric current measurement devices.

Also according to another aspect of the present invention there is provided a fault-detection device operative to detect faults in an electric transmission network, the fault-detection device containing:

a transmitter operative to transmit fast rise-time electric pulses along an electric conductor, a receiver operative to measure reflected signal associated with the fast rise-time electric pulses transmitted by another fault-detection device, a processing unit operative to detect amplitude variations of the reflected signal as a function of time, and to convert a time of the amplitude variation to a location along the electric conductor.

Additionally according to another aspect of the present invention there is provided a fault-detection device additionally containing any of:
 a power interface operative to draw electric power from electromagnetic field around a power-line conductor, and
 a communication interface operative to communicate any of the reflected signal, the time of amplitude variation, and the location along the electric conductor, to at any of another fault-detection device, and a control and analysis center.

Further according to another aspect of the present invention there is provided a fault-detection device wherein the communication interface is operative to communicate using power line carrier (PLC) communication technology.

According to another aspect of the present invention there is provided a fault-detection system operative to detect faults in an electric transmission network, the fault-detection system containing:
 a plurality of fault-detection devices deployed within the electrical transmission network, each of the fault-detection devices containing:
 a transmitter operative to transmit fast rise-time electric pulses along an electric conductor,
 a receiver operative to measure a transmitted signal associated with the fast rise-time electric pulses transmitted by another fault-detection device,
 a processing unit operative to detect amplitude variations of the transmitted signal as a function of time, and to convert a time of the amplitude variation to a location along the electric conductor.

According to yet another aspect of the present invention there is provided a fault-detection system operative to detect faults in an electric transmission network additionally containing any of
 a power interface operative to draw elect is power from electromagnetic field around a power-line conductor, and
 a communication interface operative to communicate any of:
  the reflected signal,
  the time of amplitude variation, and
  the location along the electric conductor,
 to any of
  another fault-detection device, and
  a control and analysis center.

According to still another aspect of the present invention there is provided a fault-detection system operative to detect faults in an electric transmission network wherein the communication interface is operative to communicate using power line carrier (PLC) communication technology.

Also according to another aspect of the present invention there is provided a fault-detection device operative to detect faults in an electric transmission network, the fault-detection device containing:
 a power interface operative to draw electric power from electromagnetic field around a power-line conductor,
 a transmitter operative to transmit fast rise-time electric pulses along an electric conductor,
 a receiver operative to measure any of a reflected signal associated with the fast rise-time electric pulses transmitted by another fault-detection device, and a transmitted signal associated with the fast rise-time electric pulses transmitted by another fault-detection device,
 a current sensor operative to measure current in an electric conductor to form a current measurement,
 a processing unit operative to detect amplitude variations of the reflected signal as a function of time, and/or to convert a time of the amplitude variation to a location along the electric conductor, and/or to calculate leakage current value from the current measurements,
 a communication interface operative to communicate any of the reflected signal, the time of amplitude variation, the location along the electric conductor, and/or the leakage current value, to another fault-detection device, and/or to a control and analysis center.

Unless otherwise defined, all technical and scientific terms used herein have the same meaning as commonly understood by one of ordinary skill in the art to which this invention belongs. The materials, methods, and examples provided herein are illustrative only and not intended to be limiting.

Implementation of the method and system of the present invention involves performing or completing certain selected tasks or steps manually, automatically, or a combination thereof. Moreover, according to actual instrumentation and equipment of preferred embodiments of the method and system of the present invention, several selected steps could be implemented by hardware or by software on any operating system of any firmware or a combination thereof. For example, as hardware, selected steps of the invention could be implemented as a chip or a circuit. As software, selected steps of the invention could be implemented as a plurality of software instructions being executed by a computer using any suitable operating system. In any case, selected steps of the method and system of the invention could be described as being performed by a data processor, such as a computing platform for executing a plurality of instructions.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in order to provide what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings.

DETAILED DESCRIPTION OF THE INVENTION

Figure 1:
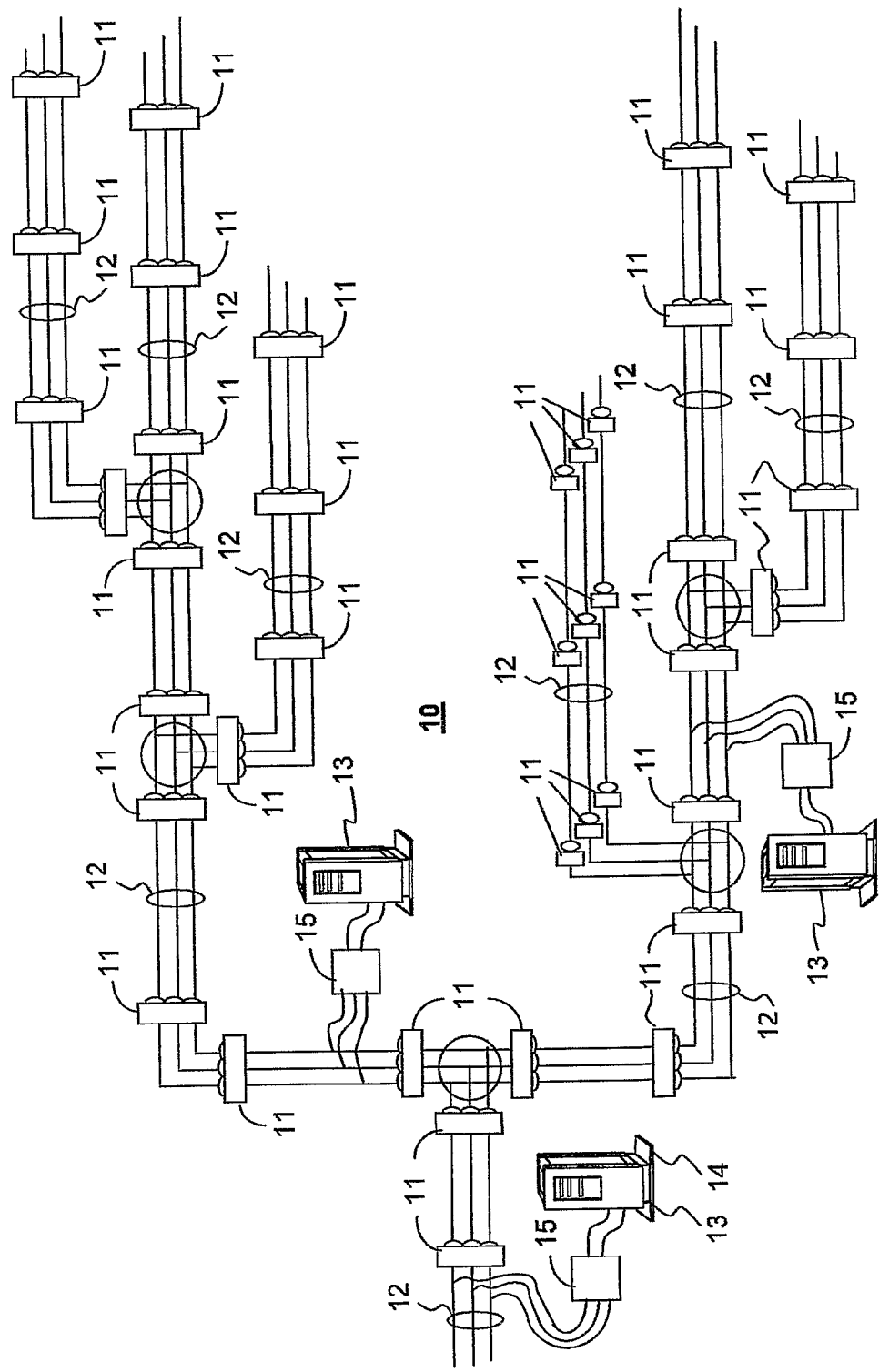
FIG. 1 is a simplified illustration of a leakage current measurement system according to a preferred embodiment of the present invention.

The principles and operation of an electric transmission network insulation fault prediction system according to the present invention may be better understood with reference to the drawings and accompanying description.

It is appreciated that the present invention is also capable of detecting events, conditions and exceptions other than those associated with insulation faults. For example, a preferred embodiment of the present invention is capable of measuring dynamic network load, inadequate reactance, inadequate conductance (e.g. non-linearity), etc.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

In this document, an element of a drawing that is not described within the scope of the drawing and is labeled with a numeral that has been described in a previous drawing has the same use and description as in the previous drawings. Similarly, an element that is identified in the text by a numeral that does not appear in the drawing described by the text, has the same use and description as in the previous drawings where it was described.

In this document the terms electric transmission network, electrical transmission network, electricity transmission network, electric power transmission, power line, power transmission and power grid can be used interchangeably and relate to either or both underground and overhead transmission.

Reference is now made to FIG. 1, which is a simplified illustration of a leakage current measurement system 10 according to a preferred embodiment of the present invention.

As shown in FIG. 1, the leakage current measurement system 10 preferably includes a plurality of current measuring devices 11 distributed over an electric transmission network 12. Preferably, the leakage current measurement system 10 also includes at least one central controller 13. Preferably, one of the central controllers 13 is a master central controller 14, preferably positioned upstream.

The central controllers 13 preferably communicate with the current measuring devices 11 using any suitable communication technology, preferably using power line carrier (PLC) communication technology. Preferably, each of the central controllers 13 is using a communication interface, preferably a PLC module 15. Preferably, each of the central controllers 13 controls a different segment of the electric transmission network 12. Optionally, the segments controlled by the different central controllers 13 at least partially overlap to provide redundancy so that the leakage current measurement system 10 is resilient to a fault of one or more central controllers 13.

It is appreciated that central controllers 13 can be connected to a cable-based communication network, preferably an Internet Protocol (IP) based communication network. It is appreciated that one or more of the plurality of central controllers 13 is used as a master central controller for controlling the other central controllers 13.

It is further appreciated that the above mentioned cable communication can use Optical fiber composite overhead ground wire (OPGW), or all-dielectric self-supporting (ADSS), or similar communication facilities that may be deployed along the electric transmission network. It is also appreciated that the communication within the network can use wireless communication technologies, such as WiFi or WiMAX, or a combination of wireless, cable (optical and/or conductive) and PLC technologies.

Whether using wired communication technology, wireless communication technology, PLC communication technology, or any other communication technology, the leakage current measurement system 10 can use short range communication technology or long range communication technology. Using long range communication technology (wired, wireless, PLC, etc) the current measuring devices 11 preferably communicate directly with their central controller 13. Alternatively, using short range communication technology (wired, wireless, PLC, etc), the current measuring devices 11 preferably communicate with their neighboring current measuring devices 11, which relay the communication upstream until it reaches the master central controller 14 and vice versa.

Preferably, the current measuring devices 11 communicate directly, or indirectly, via central controllers 13, with the master central controller 14. Preferably, the central controllers 13 communicate with the master central controller 14.

It is appreciated that the electric transmission network 12 is a three-phase transmission network 12 and that the current measuring devices 11 are three-phase current measuring devices. It is appreciated that other configurations are also possible.

Figure 2:
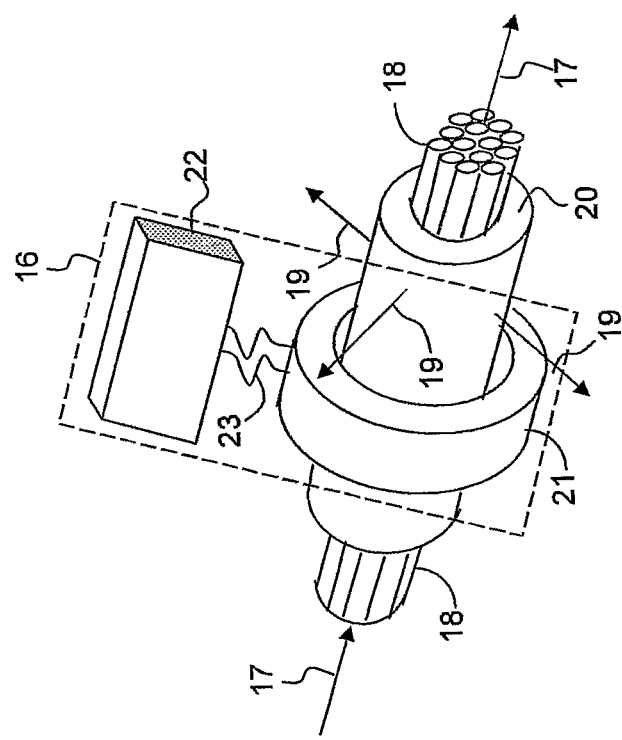
FIG. 2 is a simplified illustration of a single-phase current measurement device measuring the electric current within the electric conductor.

Reference is now made to FIG. 2, which is a simplified illustration of a single-phase current measurement device 16 measuring electric current 17 within an electric conductor 18, according to a preferred embodiment of the present invention. As seen in FIG. 2, the electric conductor 18 is carrying the electric current 17 and withstanding a leakage current 19.

It is appreciated that the electric conductor 18 is preferably wrapped with an insulation material 20, and that the leakage current 19 flows through the insulation material 20. It is also appreciated that the leakage current 19 can exist in any conductor, even when no insulation material 20 is used, and is associated with the decrease of the electric current along the electric conductor 18.

It is appreciated that in an overhead transmission network the insulation can refer to air around the conductor or to insulators used to hang the conductors from electric poles or masts. For example, leakage in an overhead transmission network may occur along the line between poles, between the conductor and the ground, between two conductors, between a phase conductor and a ground conductor, across an insulator, or along a pole.

Preferably, the single-phase current measurement device 16 contains a current sensor 21 and a measurement unit 22 preferably connected by electric wires 23. Preferably, the current sensor 21 is a coil, preferably wrapped on a toroid. The current sensor 21 preferably measures the electric current 17 within the electric conductor 18 by measuring the resulting electromagnetic inductance, and without Galvanic contact with the electric conductor 18.

Figure 3:
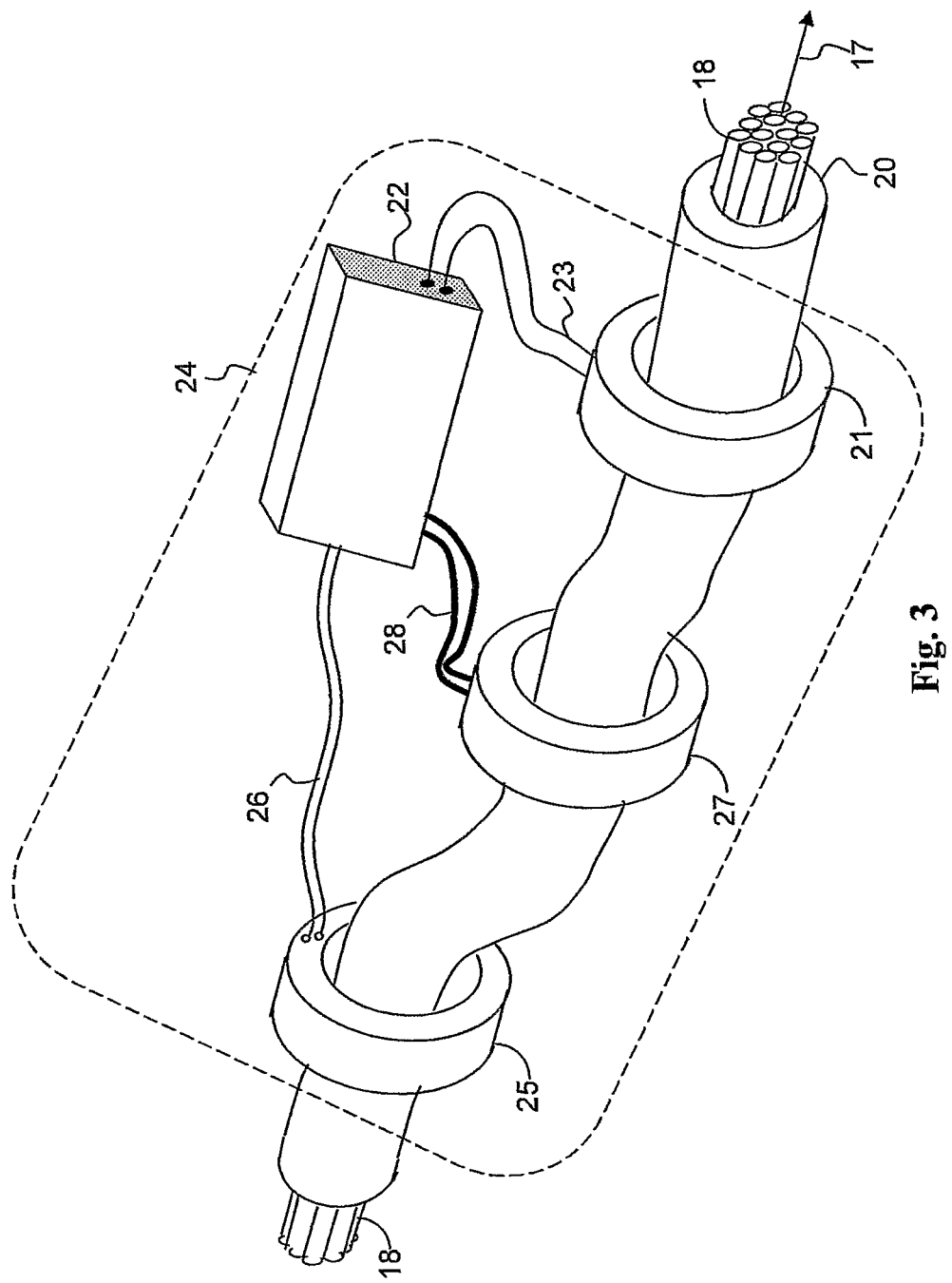
FIG. 3 is a simplified illustration of a single-phase, PLC-based, current measurement device.

Reference is now made to FIG. 3, which is a simplified illustration of a single-phase, PLC-based, current measurement device 24 according to a preferred embodiment of the present invention.

As shown in FIG. 3, the single-phase, PLC-based, current measurement device 24 includes the measurement unit 22, the current sensor 21 preferably connected to the measurement unit 22 via wires 23, and a communication interface, preferably a PLC interface 25, preferably connected to the measurement unit 22 via wires 26. Preferably, the PLC interface connects to the conductor 18 using inductance, preferably using a toroid inductance coil.

Preferably, the current measurement device 24 additionally includes a power interface 27, preferably connected to the measurement unit 22 via wires 28. The power interface 27 derives electric power for operating the current measurement device 24 from the electromagnetic field surrounding the conductor 18. Preferably, the power interface 27 uses a toroid inductance coil.

Figure 4:
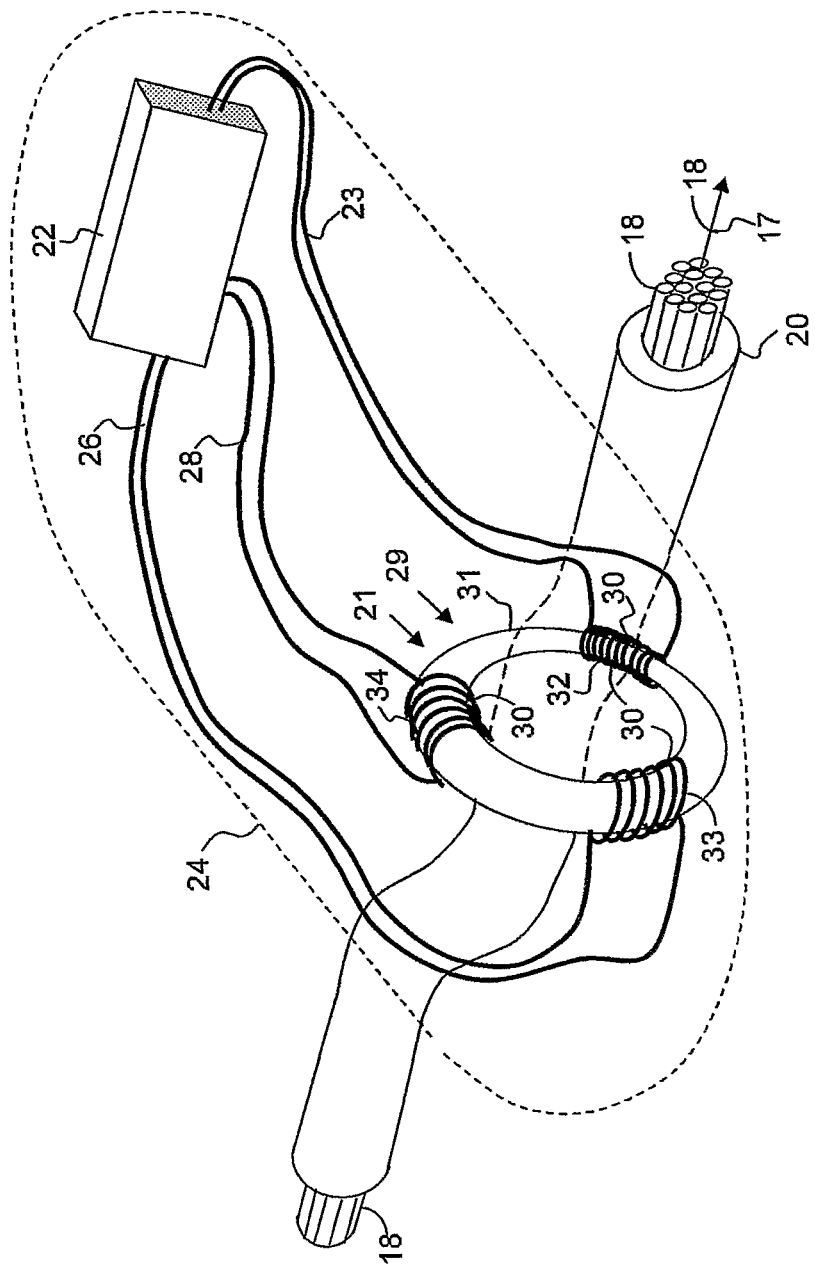
FIG. 4 is a simplified illustration of a triple-coil current sensor connected to the single-phase, PLC based, current measurement device.

Reference is now made to FIG. 4, which is a simplified illustration of a triple-coil current sensor 29 connected to the single-phase, PLC based, current measurement device 24, according to a preferred embodiment of the present invention.

As shown in FIG. 4, the triple-coil current sensor 29 preferably includes three coils 30 wrapped on a toroid 31. Coil 32 is preferably used for sensing the electric current in the conductor and preferably connects to the current measurement device 24 via wires 23. Coil 33 is preferably used to sense and induce PLC signals, and preferably connects to the current measurement device 24 via wires 26. Coil 34 is preferably used to collect electric power, and preferably connects to the current measurement device 24 via wires 28.

Figure 5:
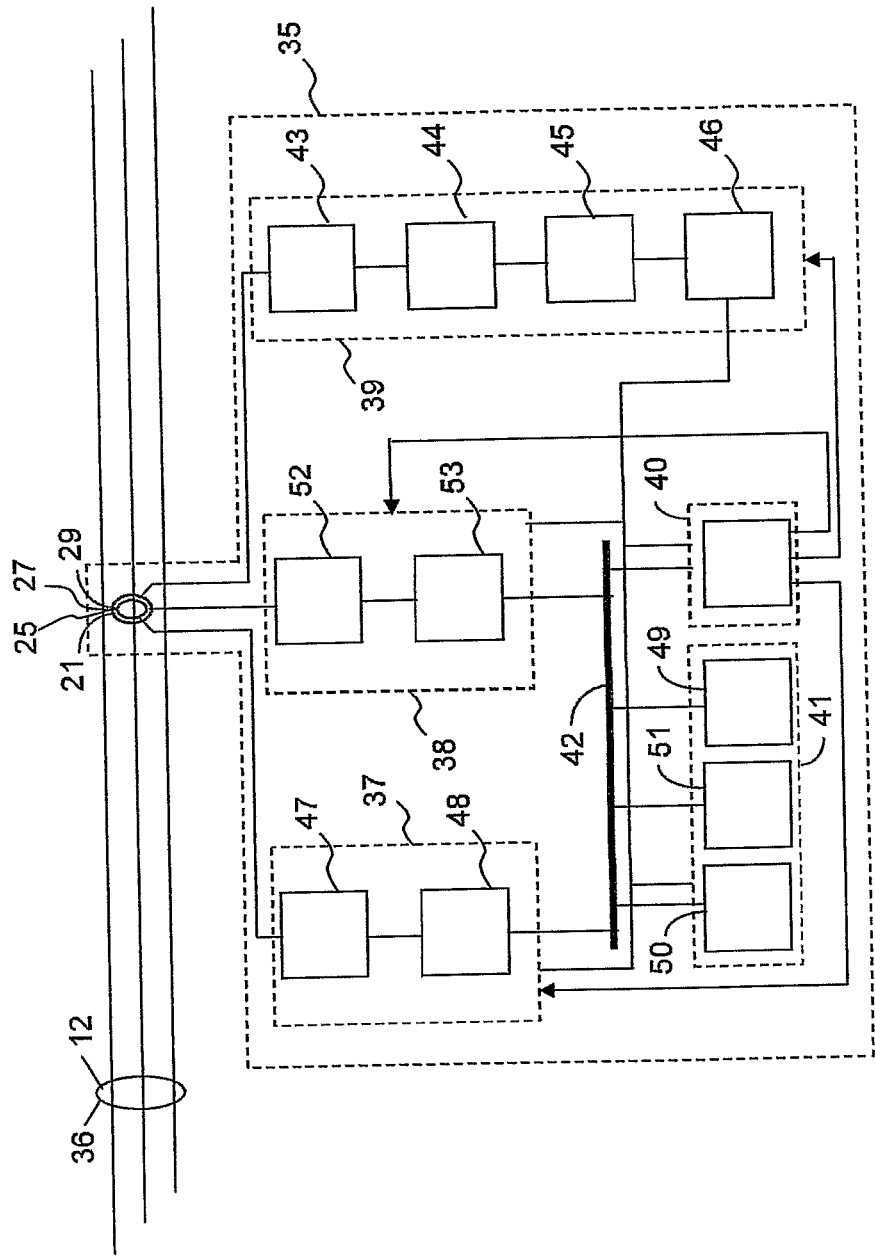
FIG. 5 is a simplified block diagram of a single phase, PLC-based, current measuring device.

Reference is now made to FIG. 5, which is a simplified block diagram of a single phase, PLC-based, current measuring device 35, according to a preferred embodiment of the present invention.

The current measuring device 35 is preferably compatible with the current measuring device 24 illustrated in FIGS. 3 and 4.

The single phase PLC based current measuring device 35 connects to the electric transmission network 12. Preferably, the transmission network 12 is a three-phase transmission network 36. Preferably the current measuring device 35 connects to the transmission network 12 using the triple-coil current sensor 29 illustrated in FIG. 4. It is appreciated that alternatively the current measuring device 35 connects to the transmission network 12 in the configuration illustrated in FIG. 3. The single phase PLC based current measuring device 35 preferably includes the following main components:

a measuring unit 37 connected to the current sensor 21, preferably configured as a part of the triple-coil current sensor 29;

a communication unit 38 connected to the PLC interface 25, preferably configured as a part of the triple-coil current sensor 29;

a power supply unit 39 connected to a power interface 27, preferably configured as a part of the triple-coil current sensor 29;

a built-in testing (BIT) unit 40 preferably connected to the measuring unit 37, to the communication unit 38, and to the power supply unit 39 in a manner enabling testing of these units;

a processing unit 41, preferably connected to all the other units via a bus 42.

The power supply unit 39 preferably includes an interface circuitry 43, a rectifier and filter circuitry 44, a voltage stabilizer 45 and a voltage converter 46. The power supply unit 39 preferably converts the electric power collected via the power interface 27 to an electric power useful to operate the current measuring device 35 and distributes the electric power (Vcc) to all the other units and modules of the single phase PLC based current measuring device 35.

The measuring unit 37 preferably contains an analog interface module 47 that connects to the current sensor 21 and an analog to digital converter 48 that converts the analog signal received from the analog interface module to a digital signal transmitted through the bus 42 to the processing unit 41.

The processing unit 41 preferably includes a processor 49, a memory 50 and a clock 51, or any other type of storage device. The memory preferably contains a software program, measurement configuration, analysis parameters and measurement data.

The communication unit 38 preferably contains an interface circuitry 52 that connects to the PLC interface 25 and a PLC modem 53. It is appreciated that the communication unit 38 can use any adequate communication technology and that the PLC technology is a preferred example. For example, the communication unit 38 can use cable communication technology such as Optical fiber composite overhead ground wire (OPGW), All-Dielectric Self-Supporting (ADSS), or wireless communication technologies such as WiFi or WiMAX, It is appreciated that either or both of the communication unit 38 and the power supply unit 39 can connect to a single phase, as shown in FIG. 5, or, alternatively, to two phases, or, also alternatively, to all the three phases of the current transmission network 36.

Preferably, the measuring unit 37 continuously measures the electric current via the current sensor 21. Preferably, the processing unit 41 samples the current measurements periodically, and/or repetitively, and/or continuously. The processing unit 41 analyzes the current measurements, preferably continuously, preferably according to the measurement configuration and analysis parameters. For example, the measuring unit 37 analyzes the current measurements by performing statistical calculations on the measurements. Preferably, the measuring unit 37 stores measuring data in the memory 50, preferably according to the measurement configuration parameters. If required, preferably according to the measurement configuration parameters, measurement data and analysis results are sent via the communication unit 38.

Optionally and preferably, the processing unit 41 is able of receiving, via the communication unit 38, current measurement data and analysis results from other current measuring devices 11. Preferably, the processing unit 41 is able of relaying the current measurement data and analysis results from other current measuring devices 11. Preferably, the processing unit 41 is able of incorporating the current measurement data and analysis results from other current measuring devices 11 in the analysis of the electric current measurements.

Optionally and preferably, the processing unit 41 is able of receiving, via the communication unit 38, updates of the software and updates of the measurement configuration and analysis parameters.

Figure 6:
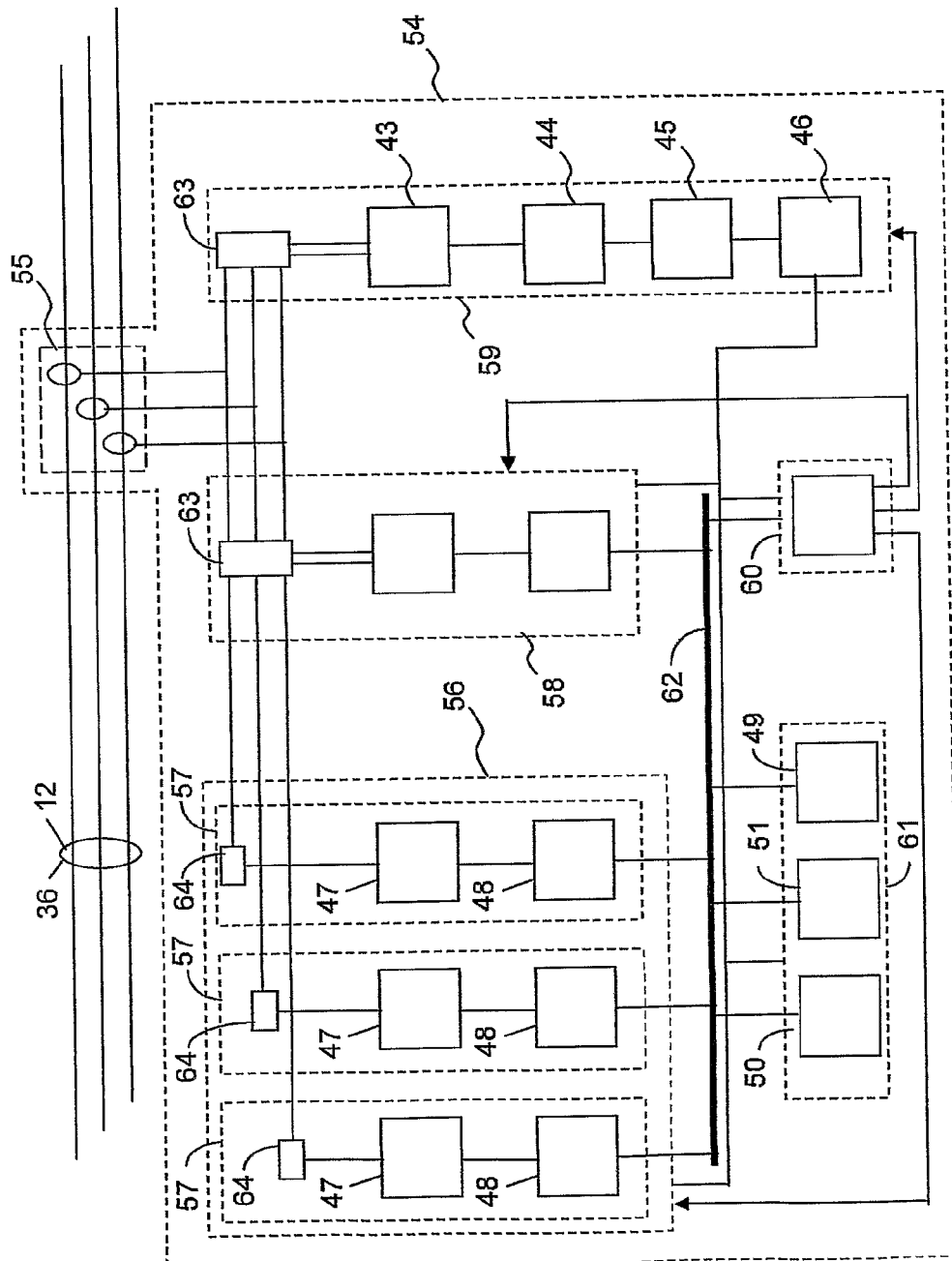
FIG. 6 is a simplified block diagram of a three-phase current measuring devices according to one embodiment of the present invention.

Reference is now made to FIG. 6, which is a simplified block diagram of a three-phase current measuring devices 54, according to a preferred embodiment of the present invention. The current measuring device 54 is another preferred embodiment of the current measuring devices 11 of FIG. 1. The current measuring device 54 preferably includes the following main components:

a network adapter unit 55, connecting to the three-phase transmission network;

a three-phase measuring unit 56, preferably containing three single phase measuring units 57, connected to the network adapter unit 55, preferably internally to the current measuring device 54;

a communication unit 58 connected to the network adapter unit 55, preferably internally to the current measuring device 54;

a power supply unit 59 connected to the network adapter unit 55, preferably internally to the current measuring device 54;

a built-in testing (BIT) unit 60 preferably connected to the three-phase measuring unit 56, to the communication unit 58, and to the power supply unit 59 in a manner enabling testing of these units;

a processing unit 61, preferably connected to all the other units via a bus 62.

The communication unit 58 and the power supply unit 59 are preferably similar to the communication unit 38 and the power supply unit 39 of the current measuring device 35 described in accordance with FIG. 5, except that they are connected to the current transmission network 36 via the network adapter unit 55, preferably internally to the current measuring device 54 via distribution modules 63. Similarly, either or both of the communication unit 38 and the power supply unit 39 can connect to a single phase, as shown in FIG. 5, or, alternatively, to two phases, or, also alternatively, to all the three phases of the current transmission network 36.

It is appreciated that the communication unit 58 can use any adequate communication technology and that the PLC technology is a preferred example. For example, the communication unit 58 can use cable communication technology such as Optical fiber composite overhead ground wire (OPGW), All-Dielectric Self-Supporting (ADSS), or wireless communication technologies such as WiFi or WiMAX, Each of the single phase current measuring units 57 is preferably similar to the measuring unit 37 of the current measuring device 35 described in accordance with FIG. 5, except that they are connected to the current transmission network 36 via the network adapter unit 55, preferably internally to the current measuring device 54 via distribution modules 64.

The BIT unit 60 is preferably similar to the BIT unit 40 of the measuring unit 37 except that it is capable of testing the three-phase measuring unit 56, and particularly, the three single-phase current measuring units 57.

Figure 7:
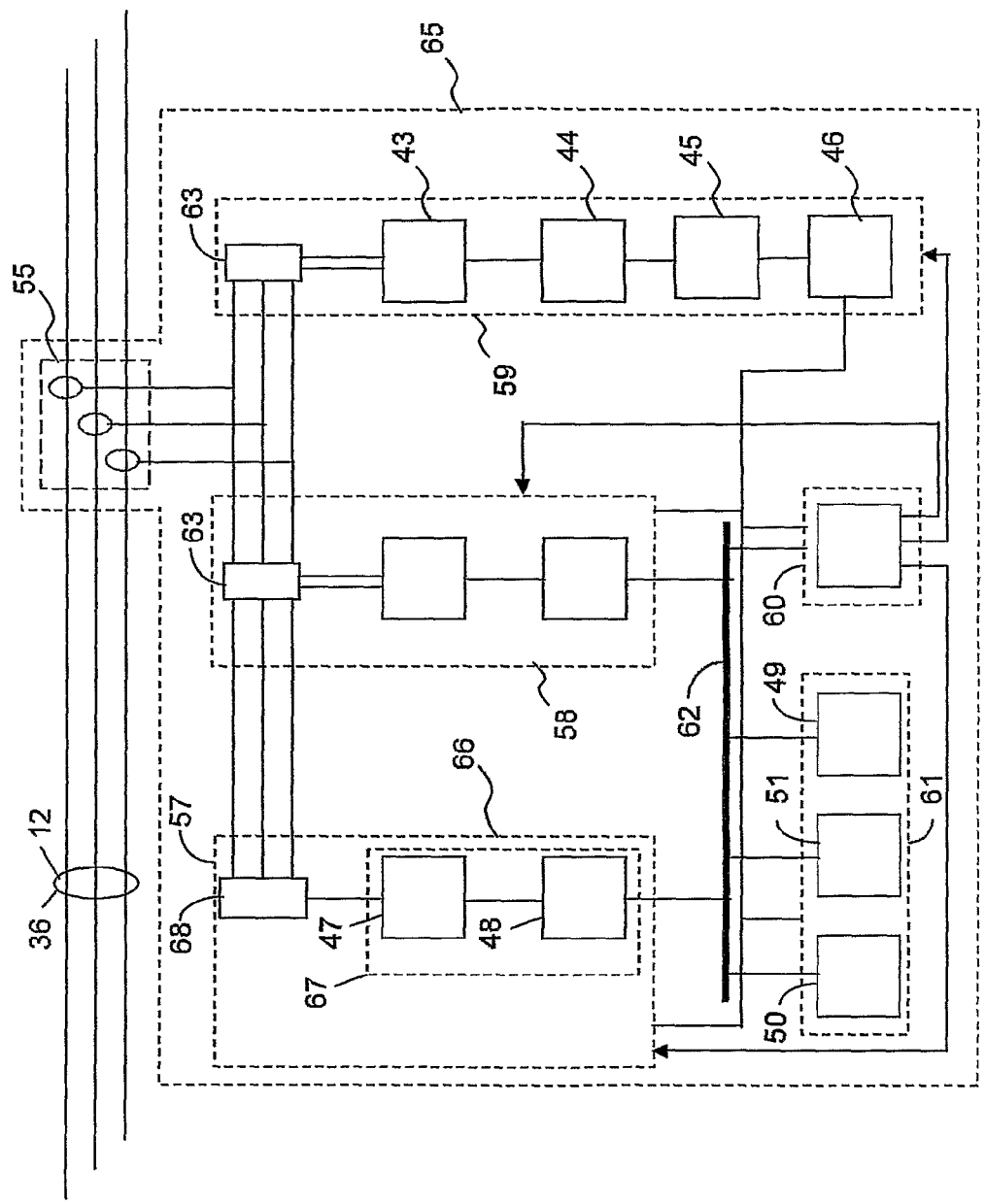
FIG. 7 is a simplified block diagram of a three-phase current measuring devices according to another embodiment of the present invention.

It is appreciated that the current measuring devices 11, whether the single-phase current measuring device 35, or the three-phase current measuring device 54, can contain a user interface, preferably including visual indications such as LEDs (light emitting diodes), numeric display, alphanumeric display, switches, keys, full keyboard, etc. Reference is now made to FIG. 7, which is a simplified block diagram of a three-phase current measuring devices 65, according to another preferred embodiment of the present invention. The current measuring device 65 differs from the current measuring devices 54 of FIG. 6 by using a three-phase measuring unit 66, preferably containing only one single phase measuring unit 67. The single phase measuring unit 67 preferably contains the analog interface module 47 and the analog to digital converter 48. The single-phase measuring unit 67 preferably connects to the network adapter unit 55, preferably internally to the current measuring device 65, via a distribution unit 68. The processor 49 controls the distribution unit 68, to connect the single phase measuring unit 67 to any one of the current phases.

Figure 8:
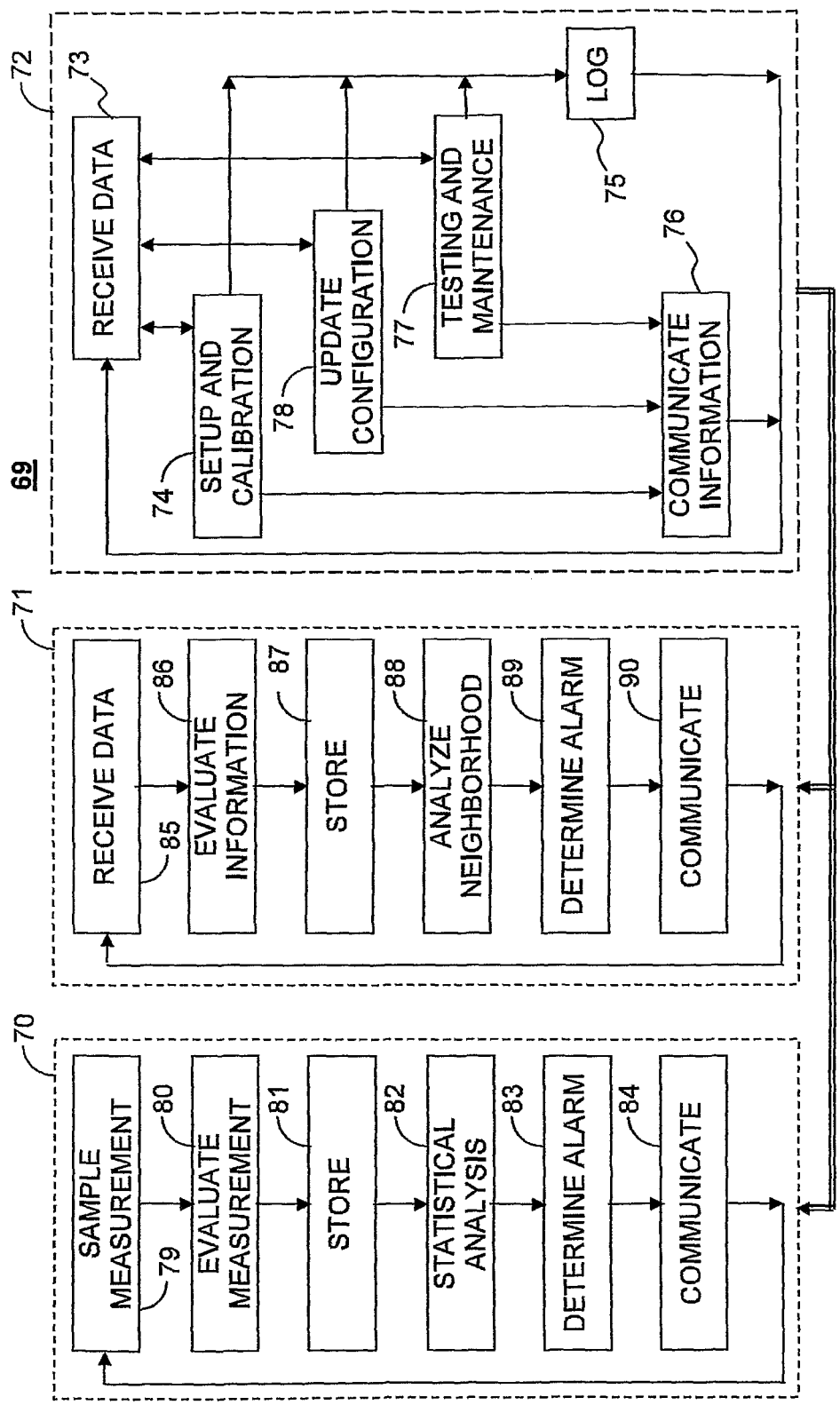
FIG. 8 is a simplified flow chart of an electric current measurement software program 1, executed by the current measuring devices.

Reference is now made to FIG. 8, which is a simplified flow chart of an electric current measurement software program 69, executed by the current measuring devices 11, according to a preferred embodiment of the present invention.

The electric current measurement software program 69 contains the following three main modules:

current measuring and analysis module 70;

communication relay and neighborhood analysis module 71; and maintenance module 72.

The three modules are preferably executed by the processor 49 of the current measuring devices 11 substantially independently of each other and concurrently.

The electric current measurement software program 69 preferably starts with the maintenance module 72 step of receiving data (step 73). Preferably, the maintenance module 72 receives setup and calibration instructions from the central controller 13. The maintenance module 72 then performs the setup and calibration instructions (step 74), preferably logs the operation (step 75) in the memory 50 of the current measuring devices 11, and confirm the operation (step 76) to the central controller 13.

The setup instructions preferably contain operational information such as:

identity of the supervising central controller 13;

current measurement parameters, such as the rate of measurement;

current analysis parameters, such as statistical parameters, such as averaging period;

alarm parameters, such as thresholds at which to send alarm messages to the central controller 13 logging parameters, such as the events that should be logged, the rate of logging, etc.;

network structure and the position of the current measuring devices 11 in the network;

identity of neighboring current measuring devices 11 positioned upstream and downstream;

communication parameters, such as the structure and content of data transmissions.

At this point, the current measuring devices 11 is ready for operation.

Preferably, the central controller 13 can now test the current measuring devices 11 by sending testing instructions, which the maintenance module 72 receives (step 73) and executes (step 77), preferably by using the BIT unit (40 or 60 of FIGS. 5 and 6 respectively). The maintenance module 72 then logs the operation (step 75), and communicates (step 76) the results to the central controller 13.

Preferably, from time to time, the central controller 13 can send to the current measuring devices 11 reconfiguration instructions. The reconfiguration instructions are mainly used to modify the operation parameters of the current measuring devices 11, to request special measurements, and to request specific reporting of current and historical (logged) information. The maintenance module 72 receives (step 73) and the reconfiguration instructions, updates the configuration (step 78), logs the operation (step 75), and communicates (step 76) the required information to the central controller 13.

It is appreciated that the current measuring device 11 can receive the information (step 73) directly from the central controller 13, preferably using long range communication technology. Alternatively, the current measuring device 11 can receive the information (step 73) from the central controller 13 indirectly, by relaying the information downstream via other current measuring devices 11, preferably using short range communication technology.

The current measuring and analysis module 70 is preferably executed continuously. The current measuring and analysis module 70 preferably starts by sampling a measurement of the electric current (step 79). The sampling, or current measurement, is preferably executed in one of the following methods:

continuously, preferably automatically, or, alternatively, by request;
repeatedly, at a predefined rate, preferably according to parameters provided by the central controller 13;
on-demand from the central controller 13;
on-demand from another current measuring devices 11, preferably positioned upstream;
synchronously, preferably according to a clocking signal distributed by a central clocking entity, such as the central controller 13;
manually; according to a user instruction.

It is appreciated that preferably the current measuring device 11 can execute current measurement in any of the above methods upon need or instruction.

The current measuring and analysis module 70 preferably proceeds to evaluate the current measurement (step 80) using evaluation algorithms and criteria preferably provided by the central controller 13 as a part of the setup and configuration information.

The current measuring and analysis module 70 preferably proceeds to store the current measurement (step 81) in the local memory 50.

The current measuring and analysis module 70 preferably proceeds to perform statistical analysis (step 82) of a predefined range of recent current measurements, preferably based on instructions provided by the central controller 13 as a part of the setup and configuration information.

The current measuring and analysis module 70 preferably proceeds to determine the need to send information to the central controller 13 (step 83). Information can be sent to the central controller 13 periodically, or upon occurrence of a predefined event, such as a deviation of the current measurement or the statistical analysis from a predefined threshold value. Preferably, the criteria to sending an alarm are provided by the central controller 13 as a part of the setup and configuration information. Alternatively, information can be sent to the central controller 13 in response to a request from the central controller 13.

It is appreciated that current measuring and analysis module 70 can calculate the dynamic network load, the load reactance, the network conductance, for example by comparing measurements of successive current measuring devices 11, leakage current, for example by comparing measurements of successive current measuring devices 11, etc. The current measuring and analysis module 70 can then determine what information should be communicated to the central controller 13.

The current measuring and analysis module 70 preferably proceeds to communicate the information (step 84), if needed, to the central controller 13.

It is appreciated that the current measuring device 11 can communicate the information to another current measuring device 11, preferably a current measuring device 11 positioned upstream, for calculating leakage current and for analyzing neighborhood situation.

The communication relay and neighborhood analysis module 71 preferably receives information (step 85) communicated from other current measuring devices 11. Typically, such other current measuring devices 11 are placed upstream. Downstream, and/or in parallel, near the current measuring device 11.

The communication relay and neighborhood analysis module 71 preferably proceeds to evaluate the received information (step 86) to determine if the information should be relayed only or whether the information should be processed to evaluate neighborhood condition.

The communication relay and neighborhood analysis module 71 preferably proceeds to store the received information (step 87) in the local memory 50, preferably only if the information is not intended for relay only.

The communication relay and neighborhood analysis module 71 preferably proceeds to analyze the neighborhood situation (step 88), preferably only if the information is not intended for relay only. The neighborhood analysis includes comparing current measurements taken by two or more neighboring current measuring devices 11, preferably in the same time. For example, leakage current can be estimated by comparing the current measured by the current measuring device 11 with the current measured at the same time by another current measuring device 11 place downstream. Neighborhood analysis preferably refers to the current value, load phase value of the three current phases, along the network (spatial analysis) and along a time-period (temporal analysis). Neighborhood analysis preferably provides indication and prediction of deterioration processes. Neighborhood analysis is especially effective in assessing leakage current and predicting its development.

The communication relay and neighborhood analysis module 71 preferably proceeds to determine the need to send information (step 89) to the central controller 13. Information can be sent to the central controller 13 periodically, or upon occurrence of a predefined event, such as a deviation of the results of the neighborhood analysis from a predefined threshold value. Preferably, the information, including raw measurements and analysis results, is sent to the central controller 13 both periodically and upon occurrence of an event. Preferably, the criteria to sending an alarm are provided by the central controller 13 as a part of the setup and configuration information.

The communication relay and neighborhood analysis module 71 preferably proceeds to determine the need to send information (step 90) to the central controller 13. Such need, for example, is an automatic periodic reporting, an alarm, typically cause by a deviation from a predefined value, or a specific request from another measuring device 11 or the central controller 13

Regarding steps 84 and 90, it is appreciated that the current measuring device 11 can communicate the information to the central controller 13 directly, using long range communication technology. Alternatively, the current measuring device 11 can communicate the information to the central controller 13 indirectly, by relaying the information upstream via other current measuring devices 11, preferably using short-range communication technology.

Figure 9:
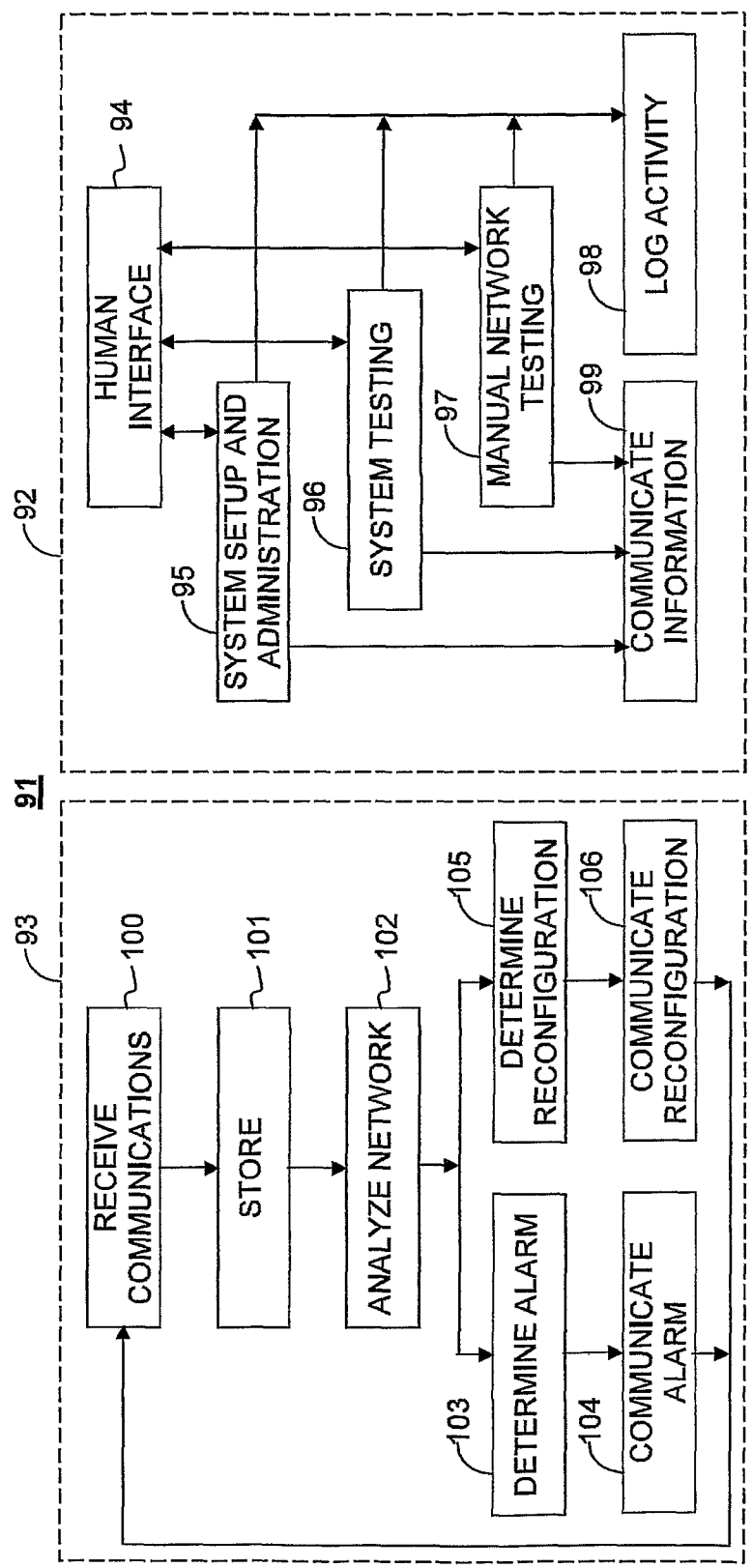
FIG. 9 is a simplified flow chart of a software program preferably executed by the central controller.

Reference is now made to FIG. 9, which is a simplified flow chart of a software program 91, preferably executed by the central controller 13, according to a preferred embodiment of the present invention.

The software program 91 preferably contains the following main modules:
a user interface module 92; and
a network analysis module 93.

The user interface module 92 enables a user to operate the leakage current measurement system 10, preferably using the following sub-modules:
human interface sub-module 94;
system setup and administration sub-module 95;
system testing sub-module 96;

network testing sub-module 97;
logger sub-module 98; and
communication sub-module 99.

The human interface sub-module 94 preferably enables the user to interact with the system setup and administration sub-module 95, the system testing sub-module 96, and the network testing sub-module 96. The human interface sub-module 94 also preferably controls peripherals of the central controller 13, such as display, keyboard, mouse, printer, etc.

The system setup and administration sub-module 95 enables the user to configure the leakage current measurement system 10 and to adapt it to the specific electric transmission network 12 or network segment. The system setup and administration sub-module 95 enables the user to perform the initial setup of the current measurement system 10 and then to reconfigure the leakage current measurement system 10 and to administer it. The system setup and administration sub-module 95 preferably supports the following components:

System configuration—enables the user to manage the leakage current measurement system 10 as a whole.
Device configuration—enables the user to control the configuration of each current measuring device 11.
Controller configuration—enables the user to control the configuration of each central controller 13.

Preferably, the setup information includes the network structure, division into segments, location of the current measuring devices 11 and the central controllers 13, association between central controllers 13 and current measuring devices 11 (preferably forming network analysis segments), etc. The measurement configuration information preferably contains measurement scheduling, analysis algorithms and parameters, thresholds values, alarm conditions, etc.

The system testing sub-module 96 enables the user to test the leakage current measurement system 10. The testing can be performed on the system as a whole, on each current measuring devices 11, preferably using the BIT unit (40 or 60), and on each central controllers 13.

The network testing sub-module 97 enables the user to perform measurement and analysis of the electric transmission network 12 and any part of it.

The user can instruct a specific current measuring device 11 to perform the following activities:

To perform a specific measurement;
to perform a specific analysis (local or neighborhood);
to send the contents of the memory or any other sequence of measurements;
to send the current configuration parameters;
to send the log of activities, etc.

The user can instruct a specific central controllers 13 to perform the following activities:

to perform analysis of a specific location of the electric transmission network 12, preferably between two adjacent current measuring devices 11;
to perform analysis of a specific segment of the electric transmission network 12;
to perform temporal analysis of the electric transmission network 12 or any part thereof, preferably based on historical measurements;
to present past analysis results;
to present the log of activities.

The user activity is logged by the logger sub-module 98 and the instructions to the respective current measuring devices 11 and central controllers 13 are communicated via the communication sub-module 99.

The network analysis module 93 is preferably executed by the central controllers 13 automatically and continuously to detect anomalies and exceptions in the electric transmission network 12 as soon as possible, to provide predictions as to possible deterioration of the conditions in the electric transmission network 12, and to provide alarms to the appropriate personnel.

The network analysis module 93 preferably receives information (step 100) from current measuring devices 11, preferably continuously. The information received from the current measuring devices 11 preferably contains current measurement results and analysis results.

The network analysis module 93 preferably proceeds to store the received information (step 101) in its storage unit.

The network analysis module 93 preferably proceeds to analyze (step 102) the condition of the electric transmission network 12, or any of its parts, preferably according to the received information and historical information stored in its storage unit.

Based on the results of the analysis, the network analysis module 93 preferably proceeds to determine if the situation requires communicating an alarm (step 103), and if an alarm is indeed required the network analysis module 93 sends the alarm (step 104) to the appropriate destination. An appropriate destination can be a user interface module, another central controller 13, such as a master central controller 14, and an external computing system.

It is appreciated that the network analysis module 93 (preferably in step 102) can calculate the dynamic network load, the load reactance, the network conductance, for example by comparing measurements of successive current measuring devices 11, leakage current, for example by comparing measurements of successive current measuring devices 11, etc.

Preferably in parallel to steps 103 and 104, the network analysis module 93 preferably determines if the situation requires reconfiguration of any part of the leakage current measurement system 10 (step 105). If reconfiguration is required the network analysis module 93 preferably sends the appropriate reconfiguration instructions (step 106) to the appropriate destination devices. Preferably, the destination devices are current measuring devices 11 and central controllers 13.

It is appreciated that the current measuring devices 11 can additionally be operated locally, manually, by a user, either via the user interface of the current measuring devices 11, or, alternatively and preferably, using a portable computer, such as a laptop computer or a PDA, equipped with a communication adapter (such as a USB adapter, a Zigbee adapter, or a PLC communication adapter).

Figure 10:
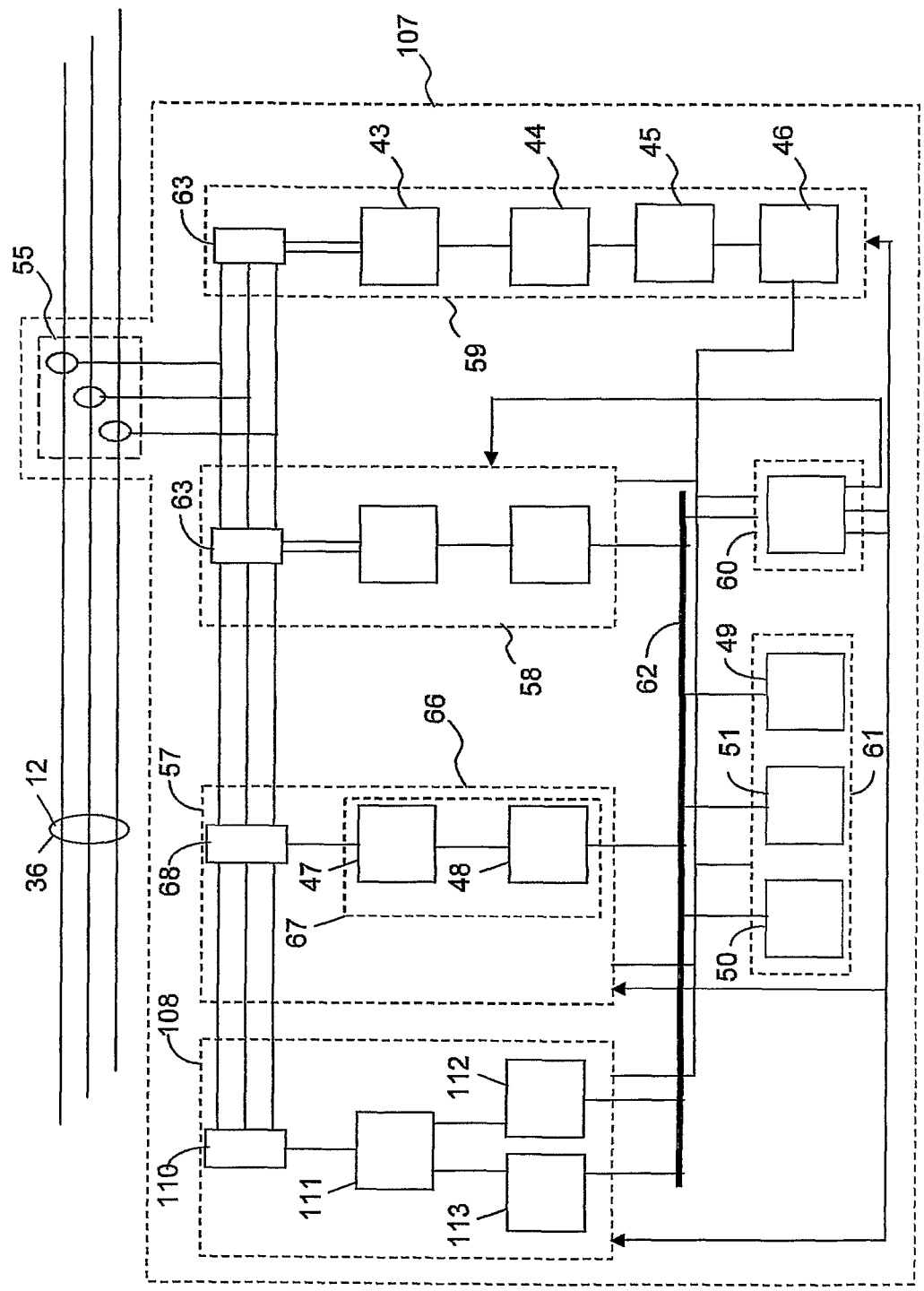
FIG. 10 is a simplified block diagram of a time-domain current measuring device.

Reference is now made to FIG. 10, which is a simplified block diagram of a time-domain current measuring device 107 according to a preferred embodiment of the present invention.

As seen in FIG. 10, the time-domain measuring device 107 is typically a three-phase current measuring device such as three-phase current measuring device 65 additionally equipped with a time-domain unit 108. It is appreciated that, alternatively, a time-domain measuring device can contain the time-domain unit 108 and a current measuring unit such as measuring unit 54. Also alternatively, a time-domain measuring device can contain the time-domain unit 108 and a single phase unit 37. Further alternatively, a time-domain measuring device can contain the time-domain unit 108 alone, without the measuring units 66, 109, or 37.

The time-domain unit 108 is operative to measure faults in the respective power line using Time-Domain Reflectometry (TDR) or Time-Domain Transmissometry (TDT). Using Time-domain reflectometry the time-domain unit 108 sends a fast rise-time electric pulse along the conductor and measures the reflected signal along time. Variations in the amplitude of the reflected signal provide indication of changes in the impedance of the line, which may be related to mechanical or electrical faults. Using time-domain transmissometry one time-domain measuring device 107 sends the fast rise-time electric pulse and another time-domain measuring device 107, preferably an adjacent time-domain measuring device 107, measures the amplitude of the arriving pulse along time. The time of reception of the amplitude variation, whether reflected or transmitted, can be converted to the location of the fault along the cable. The time-domain measuring device 107 enables the combination of the current measurements to detect leakage current and the TDR or TDT measurement to detect the location of the fault along the segment of the power line.

As seen in FIG. 10, the time-domain unit 108 preferably contains a distribution unit 110 (similar to distribution unit 68), an analog coupling interface 111, a pulse transmitter 112, and a pulse receiver 113. The pulse transmitter 112 and the pulse receiver 113 are preferably controlled by the processing unit 61. Preferably, the processing unit 61 analyzes time-domain measurements and produces time-domain information. Alternatively or additionally, the processing unit 61 sends the time-domain measurements for analysis by other entities of the leakage current measurement system 10.

The leakage current measurement system 10 shown in FIG. 1 preferably includes a plurality of time-domain measuring device 107, preferably deployed over the electric transmission network 114 like the current measuring devices 115 FIG. 1. Preferably, the central controllers 13 of the leakage current measurement system 10 shown in FIG. 1 are additionally operative to receive and to analyze time-domain information received from the time-domain measuring devices 107. Preferably, one of the central controllers 13 is a master central controller 14, preferably positioned upstream.

It is expected that during the life of this patent many relevant current measuring devices, power-line communication devices and systems, and inductance-based power supplies, will be developed, and the scope of the terms herein, particularly of the terms "current sensor" and "PLC module", is intended to include all such new technologies a priori.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A method for measuring leakage current in an electrical transmission network, said method comprising:

distributing a plurality of electric current measurement devices at different locations along at least two different parallel electric phase-carrying conductors within said electrical transmission network;

performing a first plurality of measurements of electric current, at a first plurality of locations along one of said parallel electric phase-carrying conductors, by at least two of said electric current measurement devices;

performing a second plurality of measurements of electric current, at a second plurality of locations along another of said parallel electric phase-carrying conductors, by at least two of said electric current measurement devices; and calculating leakage current between said at least two different parallel conductors by comparing said first plurality of current measurements with said second plurality of current measurements.

2. A method for leakage current measurements in an electrical transmission network according to claim 1 wherein said electrical transmission network comprises at least one of underground electrical transmission network and overhead electrical transmission network.

3. A method for leakage current measurements in an electrical transmission network according to claim 1 wherein said comparing said measurements comprises at least one of:

detecting a leakage current exception; and predicting a fault in said electrical transmission network, wherein said fault prediction is associated with said current leakage.

4. A method for leakage current measurements in an electrical transmission network according to claim 1 wherein at least one of said step of performing a first plurality of measurements and said step of performing a second plurality of measurements is being performed in a manner which is at least one of: continuously; repeatedly; on-demand from another one of said plurality of electric current measurement devices; synchronously with another one of said plurality of electric current measurement devices; and manually.

5. A method for leakage current measurements in an electrical transmission network according to claim 4 wherein said comparing said measurements is being performed in a manner which is at least one of continuously; repeatedly; on demand from another leakage current measurement devices; synchronously with another leakage current measurement devices; and manually.

6. A method for leakage current measurements in an electrical transmission network according to claim 1 wherein at least one of said step of performing said first plurality of measurements of electric current and said step of performing a second plurality of measurements of electric current comprises measuring said electric current for each power-line conductor of said electrical transmission network.

7. A method for leakage current measurements in an electrical transmission network according to claim 6 wherein said comparing said measurements comprises calculating leakage current for each power-line conductor of said electrical transmission network.

8. A method for leakage current measurements in an electrical transmission network according to claim 1 wherein at least one of said step of performing said first plurality of measurements of electric current and said step of performing a second plurality of measurements of electric current comprises measuring said electric current for each current phase of said electrical transmission network.

9. A method for leakage current measurements in an electrical transmission network according to claim 8 wherein said comparing said measurements comprises calculating leakage current for each current phase of said electrical transmission network.

10. A method for leakage current measurements in an electrical transmission network according to claim 1, said method additionally comprising, communicating said measurements over said electrical transmission network.

11. A method for leakage current measurements in an electrical transmission network according to claim 10, wherein said communicating said measurements comprises:
communicating said measurements to a control and analysis center, and
performing said comparing said measurements at least partially at said control and analysis center.

12. A method for leakage current measurements in an electrical transmission network according to claim 11, wherein said comparing said measurements is performed at least partially at said electric current measurement devices.

13. A method for leakage current measurements in an electrical transmission network according to claim 12 additionally comprising:
communicating instructions, from said control and analysis center, to at least one of said electric current measurement devices, wherein said instructions comprise at least one of
instructions pertaining to said step of performing measurements, and
instructions pertaining to said step of performing analysis; and
communicating responses pertaining to said instructions from said electric current measurement device to said control and analysis center.

14. A method for leakage current measurements in an electrical transmission network according to claim 11 wherein said step of communicating said measurements to a control and analysis center comprises communicating said measurements between neighboring electric current measurement devices.

15. A method for leakage current measurements in an electrical transmission network according to claim 11 wherein said step of communicating said measurements to a control and analysis center comprises communicating said measurements directly from said electric current measurement devices to said control and analysis center.

16. A method for leakage current measurements in an electrical transmission network according to claim 10, wherein said communicating said measurements comprises:
communicating said measurements between at least two of said electric current measurement devices; and
performing said step of calculating leakage current in at least one of said electric current measurement devices.

17. A method for leakage current measurements in an electrical transmission network according to claim 10 wherein said step of communicating said measurements comprises: using power-line carrier (PLC) communication technology.

18. A method for leakage current measurements in an electrical transmission network according to claim 17 wherein said step of communicating said measurements comprises:
inducing a PLC signal to a power-line conductor using inductance.

19. A method for leakage current measurements in an electrical transmission network according to claim 17 wherein said step of communicating said measurements comprises:
inducing a PLC signal to a power-line conductor different from said power-line conductor for which said communicated measurements of electric current are performed.

20. A method for leakage current measurements in an electrical transmission network according to claim 1 wherein said comparing comprises: estimating leakage current within a segment of said electrical transmission network.

21. A method for leakage current measurements in an electrical transmission network
according to claim 11 wherein said step of estimating leakage current comprises: comparing said measurements of electric current performed for at least two points of said segment.

22. A method for leakage current measurements in an electrical transmission network according to claim 21 wherein said comparing said measurements of electric current comprises comparing time-consecutive measurements of electric current for indicating deterioration.

23. A method for leakage current measurements in an electrical transmission network according to claim 21 wherein said comparing said measurements of electric current comprises averaging said comparisons over time.

24. A method for leakage current measurements in an electrical transmission network according to claim 1 wherein said step of measuring electric current comprises measuring electromagnetic field around a power-line conductor.

25. A method for leakage current measurements in an electrical transmission network according to claim 1 wherein said electric current measurement devices derive electric power from an electromagnetic field surrounding a power-line conductor.

26. A method for leakage current measurements in an electrical transmission network according to claim 25 wherein said power-line conductor from which electric current measurement device derive electric power is different from a power-line conductor for which said electric current measurement device performs said measurements of electric current.

27. A method for leakage current measurements in an electrical transmission network according to claim 1 wherein said comparing said measurements comprises using an expert system.

28. A method for leakage current measurements in an electrical transmission network according to claim 1 additionally comprising: providing alarm upon detecting an exception, said alarm provided to at least one of: a user; and an information computing system.

29. A leakage current measuring system comprising a plurality of leakage current measuring devices deployed at different locations along an electric transmission network, wherein each of said leakage current measuring devices comprises:
a power interface;
a current sensor operative to measure current in an electric phase-carrying conductor to form a current measurement;
a communication interface operative to communicate said current measurements between at least two of said plurality of leakage current measuring devices; and
a processing unit operative to calculate leakage current between at least two different parallel conductors by comparing a first plurality of current measurements with a second plurality of current measurements, wherein said first plurality of current measurements is taken at a first plurality of locations along one of said parallel electric phase-carrying conductors, and wherein said second plurality of current measurements is taken at a second plurality of locations along another of said parallel electric phase-carrying conductors.

30. A leakage current measuring system according to claim 29 additionally comprising a control and analysis center operative to receive said current measurements from said leakage current measuring devices and to analyze said current measurements.

31. A leakage current measuring system according to claim 30 wherein said control and analysis center is additionally operative to
   communicate instructions to at least one of said plurality of leakage current measurement devices, wherein said instructions comprise at least one of
      instructions pertaining to said step of performing measurements, and
      instructions pertaining to said step of performing analysis; and
   to receive responses pertaining to said instructions from at least one of said plurality of leakage current measurement device.

32. A leakage current measuring system according to claim 30 wherein said leakage current measurement devices are operative to communicate said current measurements between electric current measurement devices.

33. A leakage current measuring system according to claim 29, additionally comprising:
   a transmitter operative to transmit fast rise-time electric pulses along an electric conductor;
   a receiver operative to measure at least one of:
      a reflected signal associated with said fast rise-time electric pulses transmitted by another three-phase leakage current measuring device; and
      a transmitted signal associated with said fast rise-time electric pulses transmitted by another three-phase leakage current measuring device;
   a processing unit operative to detect amplitude variations of said reflected signal as a function of time and to convert said time of said amplitude variation to a location along said electric conductor; and
   wherein said communication interface is operative to communicate at least one of:
      said reflected signal;
      said time of amplitude variation;
      said location along said electric conductor; and
      said leakage current value;
   to at least one of
      another leakage current measuring device; and
      a control and analysis center.

* * * * *